(12) United States Patent
Lee et al.

(10) Patent No.: US 12,245,424 B2
(45) Date of Patent: Mar. 4, 2025

(54) ONE-TIME PROGRAMMABLE MEMORY CAPACITOR STRUCTURE AND MANUFACTURING METHOD THEREOF

(71) Applicant: UNITED MICROELECTRONICS CORPORATION, Hsinchu (TW)

(72) Inventors: Kuo-Hsing Lee, Hsinchu County (TW); Po-Wen Su, Kaohsiung (TW); Chien-Liang Wu, Tainan (TW); Sheng-Yuan Hsueh, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 495 days.

(21) Appl. No.: 17/543,757

(22) Filed: Dec. 7, 2021

(65) Prior Publication Data
US 2023/0147512 A1    May 11, 2023

(30) Foreign Application Priority Data
Nov. 8, 2021    (CN) .......................... 202111313571.7

(51) Int. Cl.
*H10B 20/25*    (2023.01)
*H01L 49/02*    (2006.01)

(52) U.S. Cl.
CPC ............. *H10B 20/25* (2023.02); *H01L 28/75* (2013.01); *H01L 28/92* (2013.01)

(58) Field of Classification Search
CPC ...... H01L 28/92; H01L 28/75; H01L 23/5256; H01L 21/76895; H01L 21/28008; H01L 29/66795; H01L 23/5252; H01L 23/5226; H01L 21/76224; H01L 29/7851; H01L 23/5283; H01L 29/785; H01L 29/0649; H01L 21/8252; H01L 29/778; H01L 29/66462; H01L 27/0629; H01L 29/2003; H01L 29/7786; H01L 28/40; H01L 29/41766; H01L 29/1066; H01L 28/91; H10B 20/25; H10B 20/20; G06F 30/394; G06F 30/398; G06F 30/39; G06F 2119/18; Y02P 90/02
(Continued)

(56) References Cited

U.S. PATENT DOCUMENTS 6,037,216 A * 3/2000 Liu .................. H10B 12/01
                                              438/398
7,084,452 B2    8/2006 Kim
(Continued)

*Primary Examiner* — Mouloucoulaye Inoussa

(57) ABSTRACT

An OTP memory capacitor structure includes a semiconductor substrate, a bottom electrode, a capacitor insulating layer and a metal electrode stack structure. The bottom electrode is provided on the semiconductor substrate. The capacitor insulating layer is provided on the bottom electrode. The metal electrode stack structure includes a metal layer, an insulating sacrificial layer and a capping layer stacked in sequence. The metal layer is provided on the capacitor insulating layer and is used as a top electrode. The insulating sacrificial layer is provided between the metal layer and the capping layer. A manufacturing method of the OTP memory capacitor structure is also provided. By the provision of the insulating sacrificial layer, the bottom electrode formed first can be prevented from being damaged by subsequent etching and other processes, so that the OTP memory capacitor structure has better electrical characteristics.

8 Claims, 8 Drawing Sheets

(58) Field of Classification Search
USPC ........ 257/530, 379, 535, 532, 758, 21.008, 257/23.149, 306, 21.021, 21.009, 21.59; 438/396, 384, 381, 382, 238, 393, 255, 438/665, 239; 365/232
See application file for complete search history.

(56) References Cited

U.S. PATENT DOCUMENTS

| | | | | |
|---|---|---|---|---|
| 2003/0089954 | A1* | 5/2003 | Sashida | H10B 53/30 257/295 |
| 2004/0180508 | A1* | 9/2004 | Park | H01L 21/76838 257/E21.582 |
| 2004/0235259 | A1* | 11/2004 | Celii | H10B 53/00 257/E21.664 |
| 2004/0256654 | A1* | 12/2004 | Korner | H01L 28/55 257/E21.59 |
| 2005/0145985 | A1* | 7/2005 | Takaya | H10B 53/00 257/532 |
| 2005/0170583 | A1* | 8/2005 | Park | H01L 28/91 257/E27.097 |
| 2005/0285173 | A1* | 12/2005 | Nagai | H10B 51/00 257/E21.663 |
| 2006/0223276 | A1* | 10/2006 | Lin | H01L 23/5223 438/393 |
| 2008/0061427 | A1* | 3/2008 | Chiang | H01L 23/50 257/E23.079 |
| 2009/0302363 | A1* | 12/2009 | Nagai | H10B 53/00 257/295 |
| 2011/0115005 | A1* | 5/2011 | Coolbaugh | H01L 27/0629 257/296 |
| 2021/0305160 | A1* | 9/2021 | Chen | H01L 23/53242 |
| 2022/0336577 | A1* | 10/2022 | Leng | H01L 21/76877 |
| 2023/0081749 | A1* | 3/2023 | Leng | H01L 28/60 257/532 |

* cited by examiner

ONE-TIME PROGRAMMABLE MEMORY CAPACITOR STRUCTURE AND MANUFACTURING METHOD THEREOF

FIELD OF THE INVENTION

The present invention relates to a semiconductor device and a manufacturing method thereof, and more particularly to a one-time programmable memory (OTP memory) capacitor structure and a manufacturing method of the one-time programmable memory capacitor structure.

BACKGROUND OF THE INVENTION

Non-volatile memory is a kind of memory that can continue to store data in the memory after the power is turned off. The non-volatile memory can be classified into read only memory (ROM), OTP memory and multi-times programmable memory. OTP memory can be classified into fuse type and anti-fuse type. Based on the characteristics of MOS devices in CMOS process technology, anti-fuse OTP memory is more suitable for integration in CMOS process technology.

Generally, anti-fuse OTP memory mainly includes MOS transistors and OTP ROM capacitors. The conventional MOS transistors have floating gate electrodes and are arranged in the memory cell area. The OTP ROM capacitors are metal-insulator-metal (MIM) capacitors and have a bottom electrode, an insulating layer and a top electrode stacked in sequence. In the manufacturing process of the conventional OTP ROM capacitor, the top electrode is easily damaged due to over-etching during the manufacturing process of the top electrode. Generally, the insulating layer used in the MIM capacitor is relatively thin. Because of the damage of the top electrode, the metal bottom electrode under the insulating layer is likely to be damaged during the subsequent manufacturing process, thereby causing the electrical abnormality of the OTP ROM capacitor.

SUMMARY OF THE INVENTION

The present invention provides an OTP memory capacitor structure and a manufacturing method of the OTP memory capacitor structure, wherein the bottom electrode is protected from damage during the manufacturing process, so as to avoid the electrical abnormality of an OTP ROM capacitor.

The OTP memory capacitor structure provided by the present invention includes a semiconductor substrate, a bottom electrode, a capacitor insulating layer and a metal electrode stack structure. The bottom electrode is provided on the semiconductor substrate. The capacitor insulating layer is provided on the bottom electrode. The metal electrode stack structure includes a metal layer, an insulating sacrificial layer and a capping layer stacked in sequence. The metal layer is provided on the capacitor insulating layer and is used as a top electrode. The insulating sacrificial layer is provided between the metal layer and the capping layer.

In an embodiment of the present invention, the bottom electrode is selected from one of a metal electrode and a polysilicon electrode.

In an embodiment of the present invention, a material of the capacitor insulating layer and the insulating sacrificial layer is oxide.

In an embodiment of the present invention, a material of the metal layer is selected from one of titanium, titanium nitride, tantalum and tantalum nitride.

In an embodiment of the present invention, a material of the capping layer is selected from one of silicon nitride, oxynitride, silicon carbide and silicon oxynitride.

In an embodiment of the present invention, a thickness of the capping layer is greater than a thickness of the insulating sacrificial layer and a thickness of the metal layer.

In an embodiment of the present invention, a thickness of the capping layer is greater than or equal to 250 angstroms, a thickness of the insulating sacrificial layer is between 30 and 50 angstroms, and a thickness of the metal layer is between 30 and 50 angstroms.

In an embodiment of the present invention, the aforementioned OTP memory capacitor structure further includes an interlayer dielectric layer, two contact plugs, and a back-end metal interconnection layer. The interlayer dielectric layer covers the capacitor insulating layer and the metal electrode stack structure. The two contact plugs are respectively electrically connected to the bottom electrode and the metal layer. The back-end metal interconnection layer is provided on the interlayer dielectric layer and electrically connected to the two contact plugs.

The manufacturing method of the OTP memory capacitor structure provided by the present invention includes: providing a semiconductor substrate; forming a bottom electrode on the semiconductor substrate; forming a capacitor insulating layer on the semiconductor substrate to cover the bottom electrode; forming a metal layer on the capacitor insulating layer; forming a first insulating sacrificial layer on the metal layer; forming a capping layer on the first insulating sacrificial layer; forming a second insulating sacrificial layer on the capping layer; forming a patterned mask layer on the second insulating sacrificial layer, wherein the patterned mask layer has a plurality of patterned openings, and part of the second insulating sacrificial layer is exposed through the plurality of patterned openings; performing a first etching process to use the patterned mask layer as an etching mask to remove part of the second insulating sacrificial layer, part of the capping layer and part of the first insulating sacrificial layer; removing the patterned mask layer; and performing a second etching process to remove the second insulating sacrificial layer, and use the retained remaining part of the capping layer as an etching mask to remove part of the metal layer to expose part of the capacitor insulating layer, wherein the remaining part of the capping layer, the remaining part of the first insulating sacrificial layer, and the remaining part of the metal layer are sequentially stacked to form a metal electrode stack structure.

In an embodiment of the present invention, the aforementioned manufacturing method of the OTP memory capacitor structure further includes: forming an interlayer dielectric layer to cover the capacitor insulating layer and the metal electrode stack structure; and forming a plurality of through holes in the interlayer dielectric layer, part of the capacitor insulating layer and the metal electrode stack structure, and forming a plurality of metal plugs in the plurality of through holes, wherein at least two of the plurality of metal plugs are respectively electrically connected to the bottom electrode and the metal layer in the metal electrode stack structure.

In an embodiment of the present invention, the step of forming the patterned mask layer includes: forming an anti-reflective layer on the second insulating sacrificial layer; forming a patterned photoresist layer on the anti-reflective layer; and using the patterned photoresist layer as an etching mask to remove part of the anti-reflective layer, so that the anti-reflective layer has the plurality of patterned openings.

The OTP memory capacitor structure of the present invention uses the metal layer in the metal electrode stack structure as the top electrode. The metal electrode stack structure includes the metal layer, an insulating sacrificial layer and a capping layer. When the OTP memory capacitor structure is manufactured, the provision of the insulating sacrificial layer can prevent the bottom electrode formed first from being damaged by subsequent etching and other processes, so that the OTP memory capacitor structure of the embodiment of the present invention has better electrical characteristics.

BRIEF DESCRIPTION OF THE DRAWINGS

The present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
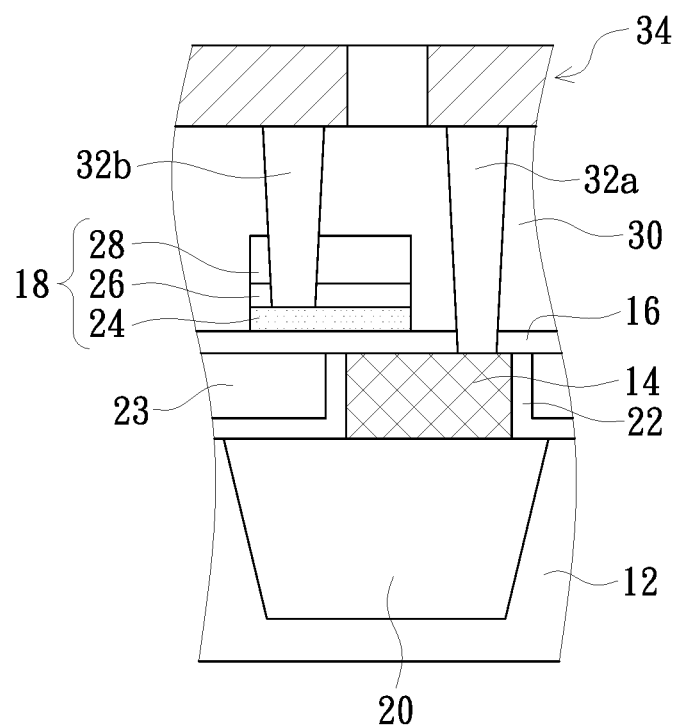
FIG. 1 is a schematic cross-sectional view of an OTP memory capacitor structure according to an embodiment of the present invention.

FIG. 1 is a schematic cross-sectional view of an OTP memory capacitor structure according to an embodiment of the present invention. As shown in FIG. 1, the OTP memory capacitor structure 10 includes a semiconductor substrate 12, a bottom electrode 14, a capacitor insulating layer 16 and a metal electrode stack structure 18. The semiconductor substrate 12 may include semiconductor materials such as silicon, germanium or other elements, or the semiconductor substrate 12 may be made of materials such as silicon carbide, gallium nitride, gallium arsenide, indium arsenide, indium phosphide, silicon germanium, silicon germanium carbide, gallium arsenide phosphide, or indium gallium phosphide, etc., or the semiconductor substrate 12 includes a silicon-on-insulator (SOI) substrate. In one embodiment, an isolation structure 20 is formed in the semiconductor substrate 12, and the isolation structure 20 is, for example, a shallow trench isolation structure.

The bottom electrode 14 is provided on the semiconductor substrate 12. The bottom electrode 14 can be a metal electrode or a polysilicon electrode. In one embodiment, a spacer layer 22 is optionally formed on the semiconductor substrate 12 and the sidewall of the bottom electrode 14. An interlayer dielectric (ILD) layer 23 is provided on the semiconductor substrate 12, and the material of the ILD layer 23 is, for example, oxide.

The capacitor insulating layer 16 is provided on the bottom electrode 14 to cover the ILD layer 23. The material of the capacitor insulating layer 16 is, for example, oxide, and the thickness of the capacitor insulating layer 16 is approximately between 30 and 50 angstroms (Å). The metal electrode stack structure 18 includes a metal layer 24, an insulating sacrificial layer 26 and a capping layer 28 stacked in sequence. The metal layer 24 is provided on the capacitor insulating layer 16 and is used as a top electrode. The insulating sacrificial layer 26 is provided between the metal layer 24 and the capping layer 28. In one embodiment, the material of the metal layer 24 is, for example, titanium, titanium nitride, tantalum, or tantalum nitride, the material of the insulating sacrificial layer 26 is, for example, oxide, and the material of the capping layer 28 is, for example, silicon nitride (SiN), nitrogen oxide, silicon carbide (SiC), silicon oxynitride (SiON). The thickness of the capping layer 28 is greater than the thickness of the insulating sacrificial layer 26 and the thickness of the metal layer 24. In one embodiment, the thickness of the capping layer 28 is greater than or equal to 250 angstroms, the thickness of the insulating sacrificial layer 26 is approximately between 30 and 50 angstroms, and the thickness of the metal layer 24 is approximately between 30 and 50 angstroms.

As shown in FIG. 1, the OTP memory capacitor structure 10 further includes an ILD layer 30, two contact plugs 32a, 32b and a back-end metal interconnection layer 34. The ILD layer 30 covers the capacitor insulating layer 16 and the metal electrode stack structure 18. The contact plugs 32a, 32b are electrically connected to the bottom electrode 14 and the metal layer 24 (top electrode), respectively. The back-end metal interconnection layer 34 is provided on the ILD layer 30 and is electrically connected to the contact plugs 32a, 32b.

Figure 2:
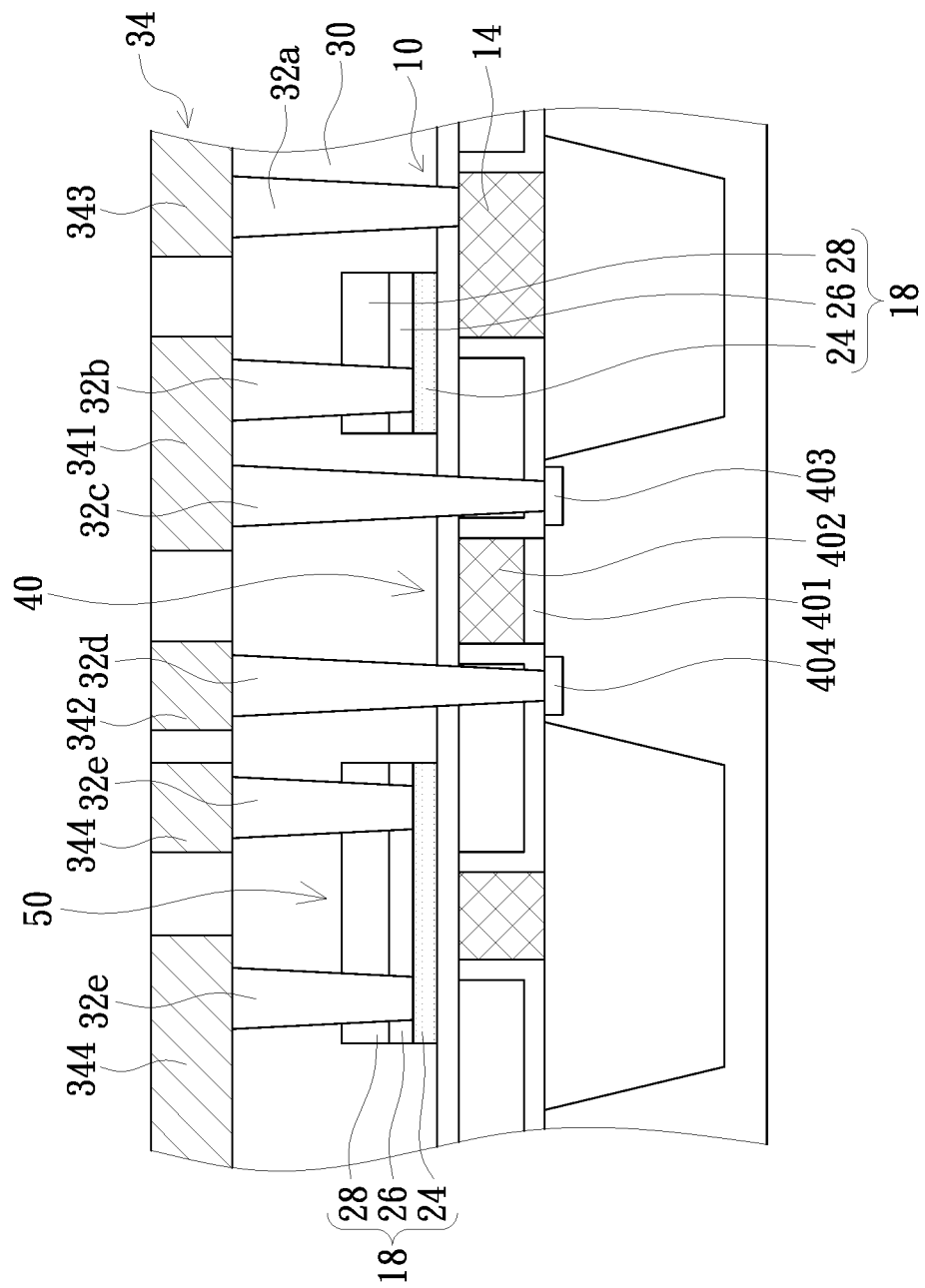
FIG. 2 is a schematic view of a structure of an OTP memory according to an embodiment of the present invention.

The OTP memory capacitor structure 10 in the above embodiment is applied to an OTP memory, and each bit cell of the OTP memory includes a transistor structure and an OTP memory capacitor structure. FIG. 2 is a schematic view of a structure of an OTP memory according to an embodiment of the present invention. In addition to a transistor structure 40 and an OTP memory capacitor structure 10, a high resistance resistor (HIR) structure 50 is also shown in the figure. The ILD layer 30 covers the OTP memory capacitor structure 10, the transistor structure 40 and the HIR structure 50 at the same time, and the back-end metal interconnection layer 34 is provided on the ILD layer 30. In one embodiment, the back-end metal interconnection layer 34 may include conductive contacts such as a common contact 341, a bit-line contact 342, a source-line contact 343 and a resistance contact 344. In one embodiment, the contact plug 32b connected to the metal layer 24 (top electrode) of the OTP memory capacitor structure 10 is, for example, electrically connected to the common contact 341, and the contact plug 32a connected to the bottom electrode 14 is, for example, electrically connected to the source-line contact 343.

Following the above description, the transistor structure 40 includes a gate oxide layer 401, a gate electrode 402 and a source electrode 403/drain electrode 404. The source electrode 403 (or drain electrode 404) is connected to the common contact 341 of the back-end metal interconnection layer 34 by the contact plug 32c, so that the source electrode 403 (or drain electrode 404) of the transistor structure 40 is electrically connected to the metal layer 24 (top electrode) of the OTP memory capacitor structure 10. The drain electrode 404 (or source electrode 403) of the transistor structure 40 is connected to the bit-line contact 342 of the back-end metal interconnection layer 30 by the contact plug 32d. In addition, the gate electrode 402 of the transistor structure 40 can subsequently be electrically connected to a word line (not shown).

The HIR structure 50 is the same as or similar to the metal electrode stack structure 18 in the OTP memory capacitor structure 10 of the embodiment of the present invention. That is, the HIR structure 50 includes a metal layer 24, an insulating sacrificial layer 26 and a capping layer 28 stacked in sequence, and the HIR structure 50 and the metal electrode stack structure 18 are formed by the same process. In other words, the OTP memory capacitor structure 10 of the embodiment of the present invention uses the HIR structure 50 as the bottom electrode of a capacitor structure. In addition, the HIR structure 50 is electrically connected to the resistance contact 344 of the back-end metal interconnection layer 30 by a contact plug 32e.

Figure 3A:
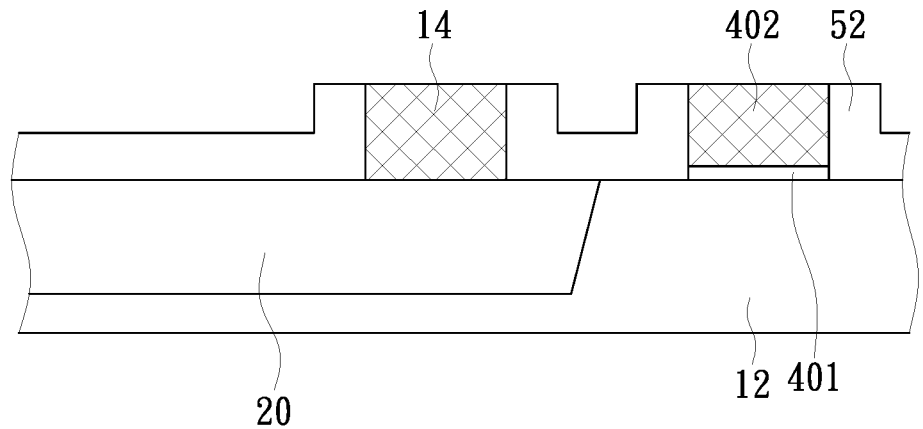
FIGS. 3A to 3J are schematic cross-sectional views for illustrating various stages of a manufacturing method of an OTP memory capacitor structure according to an embodiment of the present invention.

FIGS. 3A to 3J are schematic cross-sectional views for illustrating various stages of a manufacturing method of an OTP memory capacitor structure according to an embodiment of the present invention. In this embodiment, in addition to forming the OTP memory capacitor structure, a plurality of HIR structures and a transistor structure can be formed at the same time with part of the same process. As shown in FIG. 3A, a semiconductor substrate 12 is provided, and an isolation structure 20 is formed in the semiconductor substrate 12. The isolation structure 20 can be formed by local oxidation of silicon (LOCOS) isolation technology or shallow trench isolation (STI) technology. In some embodiments, the isolation structure 20 is made of silicon oxide, silicon nitride, silicon oxynitride or other suitable dielectric materials.

Please continue to refer to FIG. 3A. A bottom electrode 14 is formed on the semiconductor substrate 12. The bottom electrode 14 can be a metal electrode or a polysilicon electrode. In one embodiment in which the bottom electrode 14 is a polysilicon electrode, the method of forming the bottom electrode 14 may include forming a polysilicon layer (not shown) on the substrate 12 first, and then performing an etching process, such as a dry etching process, a wet etching process, a plasma etching process, and a reactive ion etching (RIE) process or other suitable processes, on the polysilicon layer, to form the patterned bottom electrode 14 on the semiconductor substrate 12. In one embodiment, a gate electrode 402 of a transistor structure 40 (shown in FIG. 2) can also be formed by the same process when forming the bottom electrode 14, wherein a gate oxide layer 401 is first formed between the gate electrode 402 and the semiconductor substrate 12. Then, as shown in FIG. 3A, a spacer layer 52 is formed on the semiconductor substrate 12, the sidewall of the gate electrode 402 and the sidewall of the bottom electrode 14 through a deposition process. The material of the spacer layer 52 can be silicon nitride, nitrogen oxide, silicon carbide, silicon oxynitride, oxide or other suitable materials, and the material can be deposited by chemical vapor deposition (CVD) process, plasma enhanced chemical vapor deposition (PECVD) process, sputtering or other suitable processes.

Figure 3B:
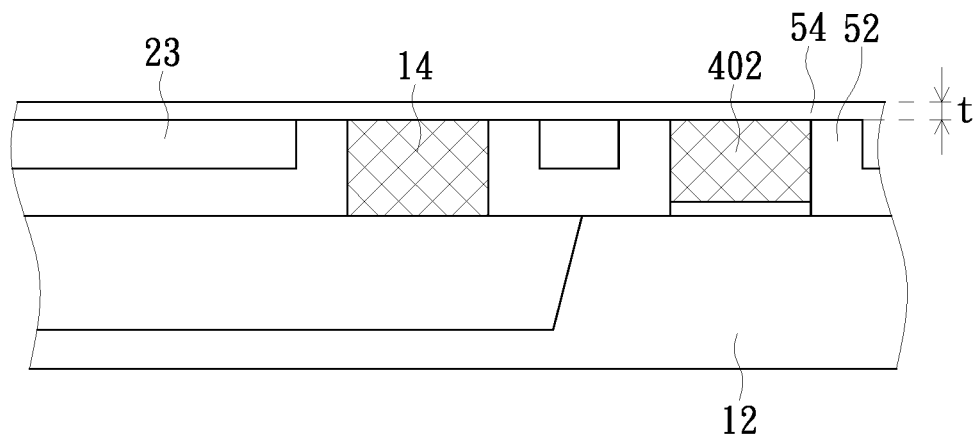

Then, as shown in FIG. 3B, a capacitor insulating layer 54 is formed to cover the bottom electrode 14 and the gate electrode 402. In one embodiment, the material of the capacitor insulating layer 54 is oxide, and the thickness t of the capacitor insulating layer 54 covering the bottom electrode 14 is approximately between 30 and 50 angstroms. In one embodiment, before the capacitor insulating layer 54 is formed, an ILD layer 23 has been formed on the semiconductor substrate 12, and the top surfaces of the ILD layer 23, the bottom electrode 14, the gate electrode 402 and the spacer layer 52 have been subjected to a planarization polishing process.

Figure 3C:
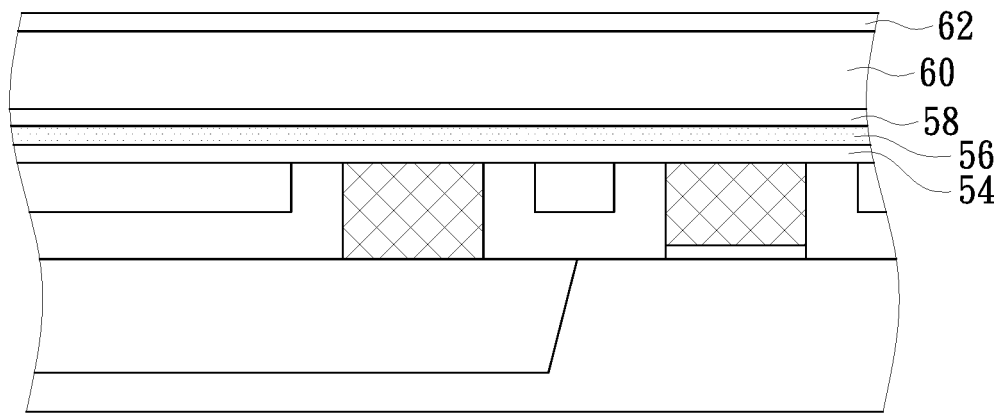

Then, as shown in FIG. 3C, a metal layer 56, a first insulating sacrificial layer 58, a capping layer 60 and a second insulating sacrificial layer 62 are sequentially formed on the capacitor insulating layer 54. Specifically, the metal layer 56 is formed on the capacitor insulating layer 54, the first insulating sacrificial layer 58 is formed on the metal layer 56, the capping layer 60 is formed on the first insulating sacrificial layer 58, and the second insulating sacrificial layer 62 is formed on the capping layer 60. In one embodiment, the material of the metal layer 56 may be titanium, titanium nitride, tantalum or tantalum nitride. The thickness of the metal layer 56 is approximately between 30 and 50 angstroms. Preferably, the thickness of the metal layer 56 is 40 angstroms. In one embodiment, the material of the first insulating sacrificial layer 58 and the second insulating sacrificial layer 62 is oxide. The thickness of the first insulating sacrificial layer 58 is approximately between 30 and 50 angstroms. Preferably, the thickness of the first insulating sacrificial layer 58 is 30 angstroms. The thickness of the second insulating sacrificial layer 62 is 50 angstroms. In one embodiment, the material of the capping layer 60 may be silicon nitride, oxynitride, silicon carbide, or silicon oxynitride. Preferably, the material of the capping layer 60 is silicon nitride. The thickness of the capping layer 60 is greater than the thickness of the first insulating sacrificial layer 58 and the thickness of the metal layer 56. The thickness of the capping layer 60 is greater than or equal to 250 angstroms. Preferably, the thickness of the capping layer 60 is about 270 angstroms.

Figure 3D:
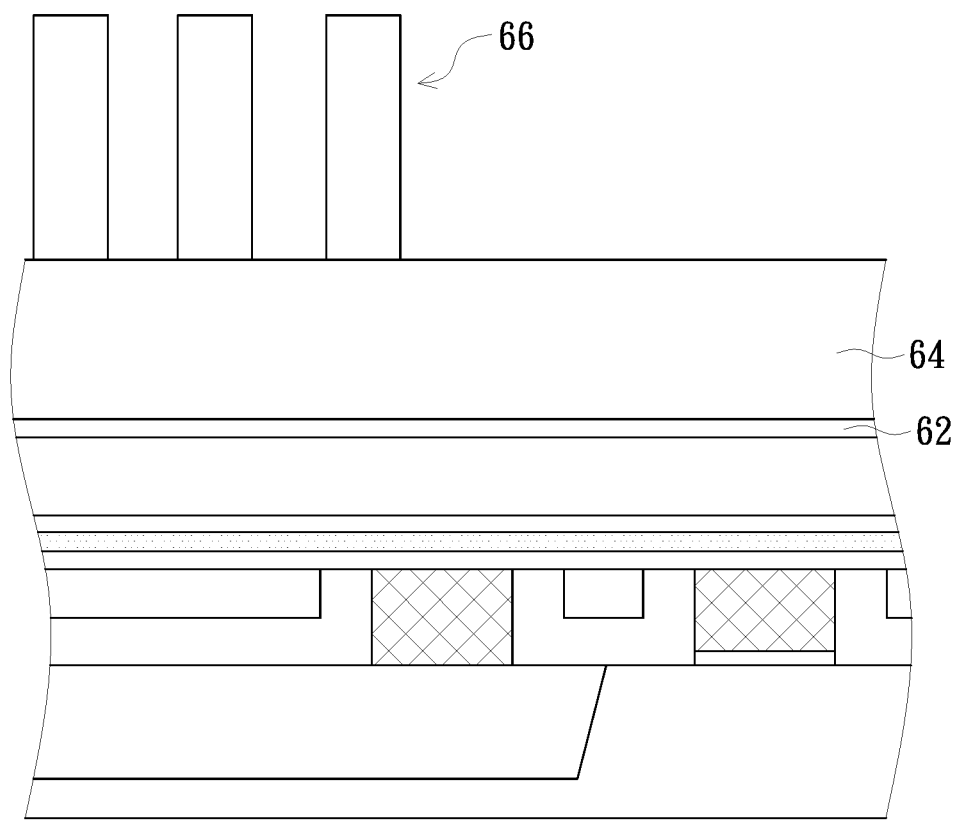
Figure 3E:
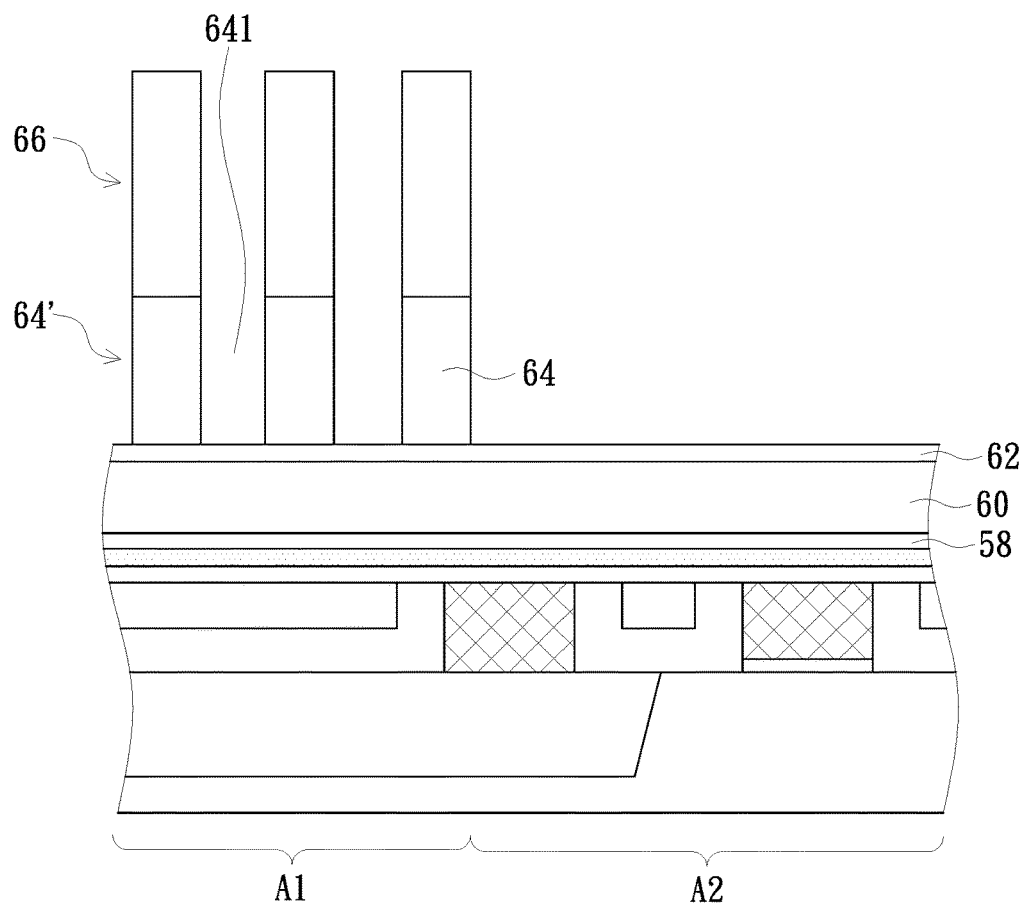

Then, a patterned mask layer is formed on the second insulating sacrificial layer 62, wherein the patterned mask layer has a plurality of patterned openings. In one embodiment, the method of forming the patterned mask layer may include forming an anti-reflective layer 64 on the second insulating sacrificial layer 62, and then forming a patterned photoresist layer 66 on the anti-reflective layer 64, as shown in FIG. 3D. In one embodiment, the thickness of the anti-reflective layer 64 is, for example, 1000 angstroms, and the thickness of the patterned photoresist layer 66 is, for example, 2000 angstroms. Then, as shown in FIG. 3E, the patterned photoresist layer 66 is used as an etching mask to remove part of the anti-reflective layer 64, so that the anti-reflective layer 64 having a plurality of patterned openings 641 can be used as a patterned mask layer 64'. A part of the second insulating sacrificial layer 62 is exposed through the patterned openings 641. In one embodiment, the partial anti-reflective layer 64 between the partial patterned openings 641 can be used to define the formation position of the subsequent HIR structures 50 (shown in FIG. 2), and one of the HIR structures 50 can be used as the top electrode of the OTP memory capacitor structure 10 (shown in FIG. 2) of the embodiment of the present invention. In one embodiment, the semiconductor substrate 12 can be divided into a dense distribution area A1 and an isolated distribution area A2 according to the distribution of the subsequent HIR structures 50. Then, the patterned photoresist layer 66 is removed.

Figure 3F:
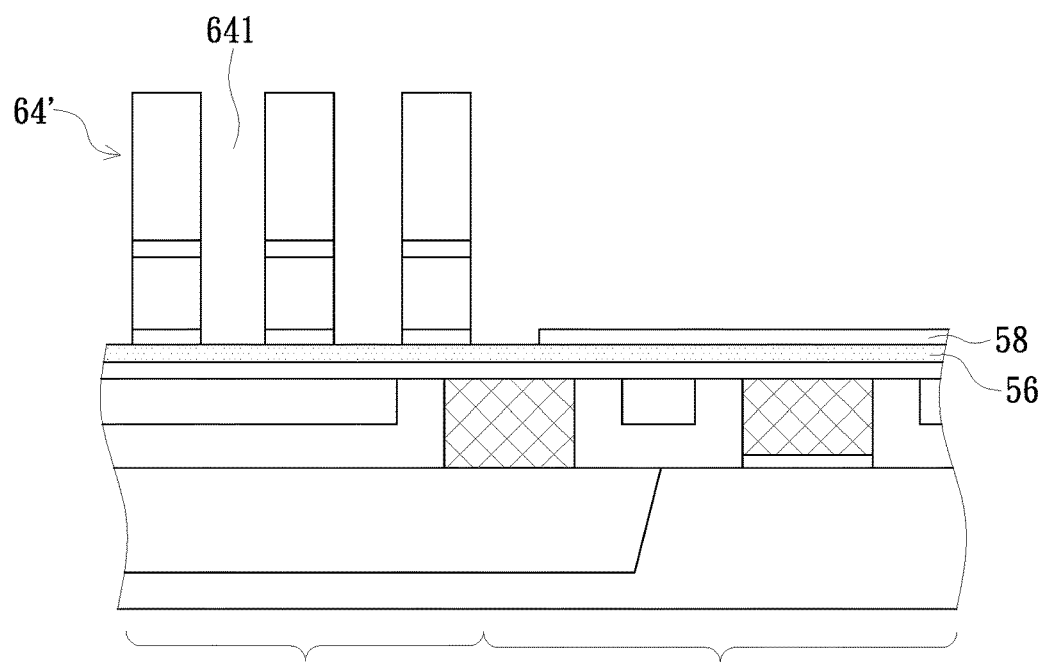

Then, a first etching process is performed. Specifically, as shown in FIG. 3F, the patterned mask layer 64' is used as an etching mask to remove part of the second insulating sacrificial layer 62, part of the capping layer 60 and part of the first insulating sacrificial layer 58. In one embodiment, the end point detection in the first etching process is set to the first insulating sacrificial layer 58 in the isolated distribution area A2, that is, the first insulating sacrificial layer 58 in the isolated distribution area A2 is used as the etching stop layer. With the removal of part of the second insulating sacrificial layer 62 and part of the capping layer 60 by the first etching process, the first insulating sacrificial layer 58 in the isolated distribution area A2 is retained due to being as an etching stop layer, as shown in FIG. 3F; however, the part of the first insulating sacrificial layer 58 exposed by the corresponding patterned openings 641 in the dense distribution area A1 is removed. The metal layer 56 in either the dense distribution area A1 or the isolated distributed area A2 is protected by the first insulating sacrificial layer 58 and will not be damaged or affected by the first etching process.

Figure 3G:
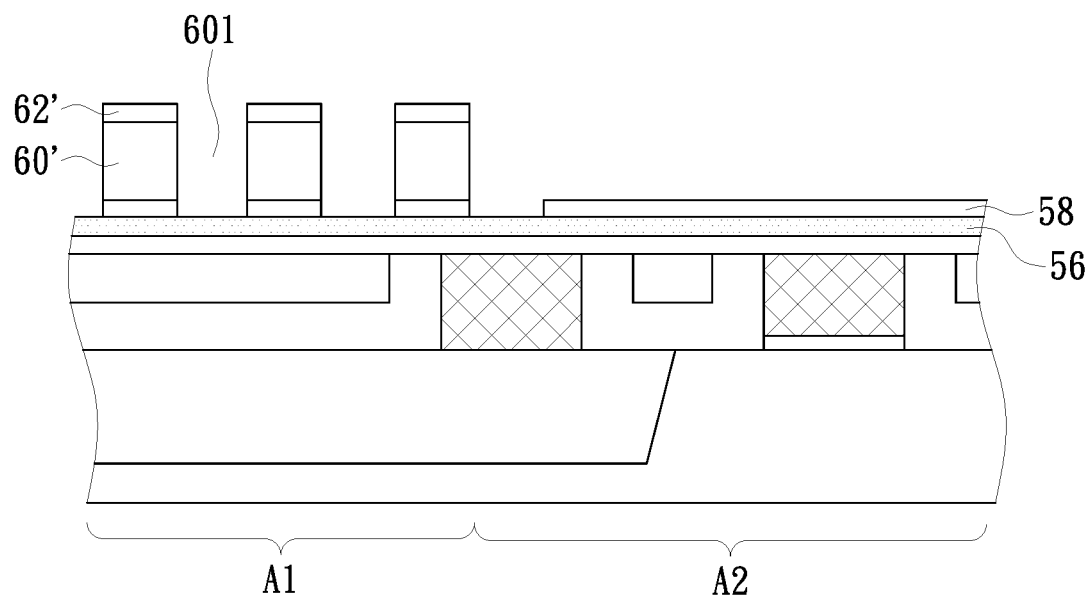

Then, as shown in FIG. 3G, the patterned mask layer 64' is removed. The remaining capping layer 60' in the dense distribution area A1 has isolation spaces 601. The isolation spaces 601 correspond to the patterned openings 641 of the patterned mask layer 64' (shown in FIG. 3F). The metal layer 56 in the dense distribution area A1 is exposed by the isolation spaces 601. The first insulating sacrificial layer 58 is optionally retained in the isolated distribution area A2.

Figure 3H:
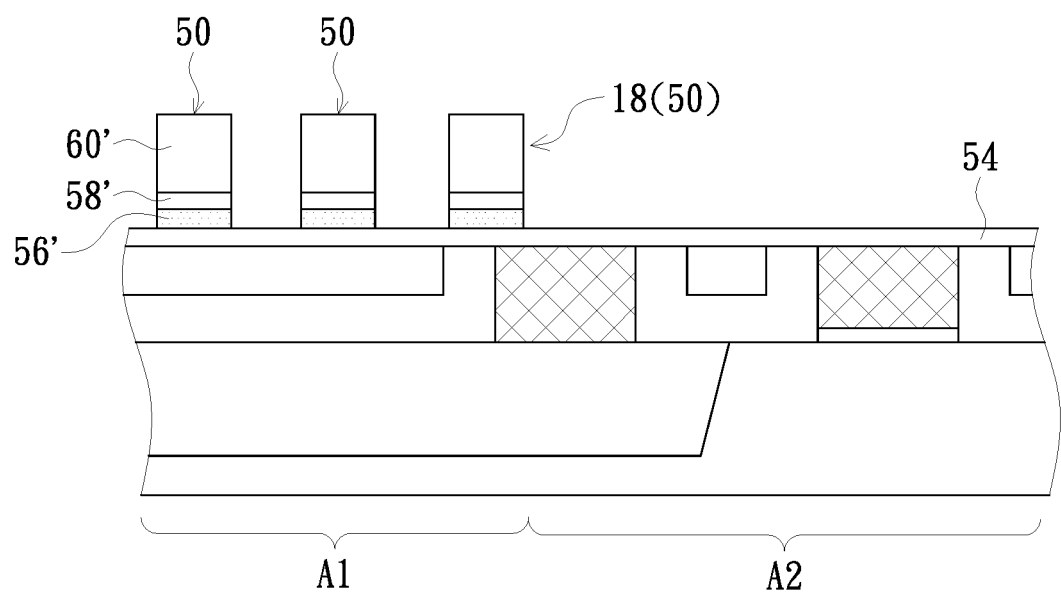

Then, a second etching process is performed. Specifically, as shown in FIG. 3H, the second insulating sacrificial layer 62' in the dense distribution area A1 and the first insulating sacrificial layer 58 in the isolated distributed area A2 are removed first, and the remaining part of the capping layer 60' is used as an etching mask to remove the part of the metal layer 56 exposed by the isolation space 601 in the dense distribution area A1 and the exposed metal layer 56 exposed in the isolated distribution area A2 to expose part of the capacitor insulating layer 54. The remaining part of the capping layer 60', the remaining part of the first insulating sacrificial layer 58' and the remaining part of the metal layer 56' are sequentially stacked to form a plurality of HIR structures 50, wherein one of the HIR structures 50 can be used as the metal electrode stack structure 18 of the OTP memory capacitor structure 10.

Figure 3I:
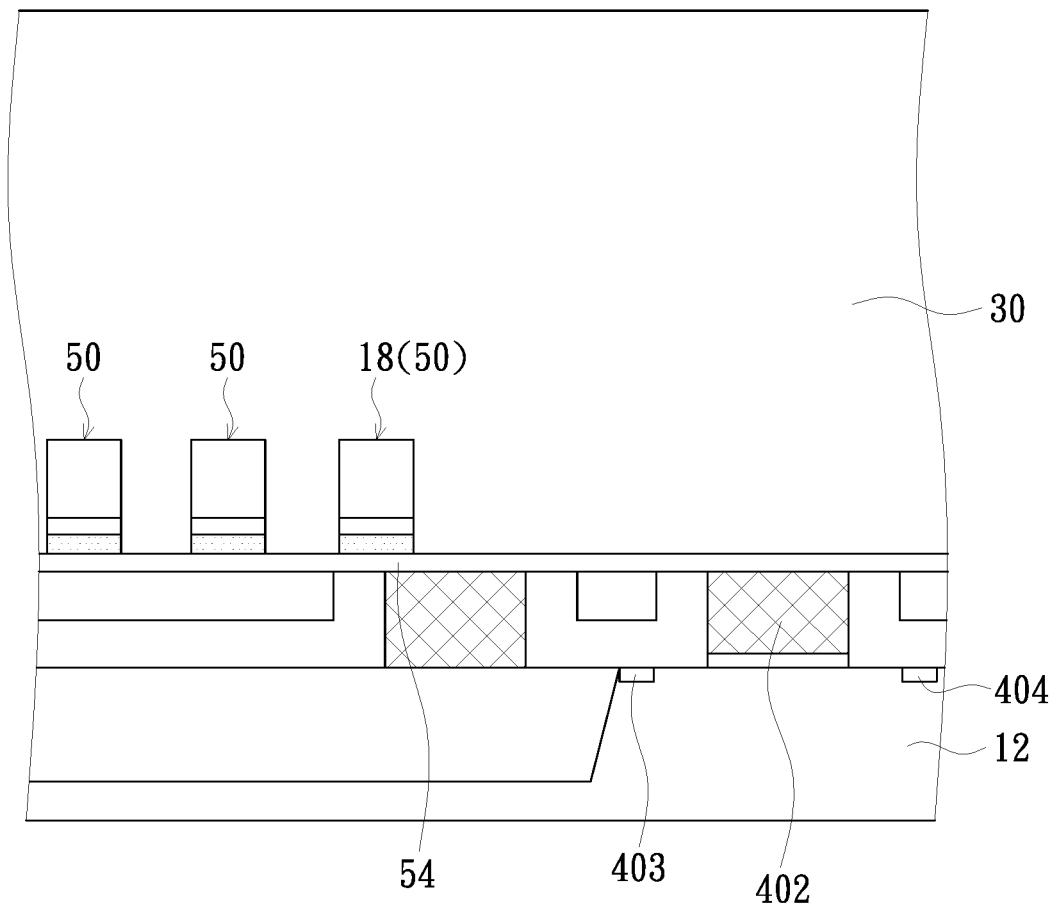
Figure 3J:
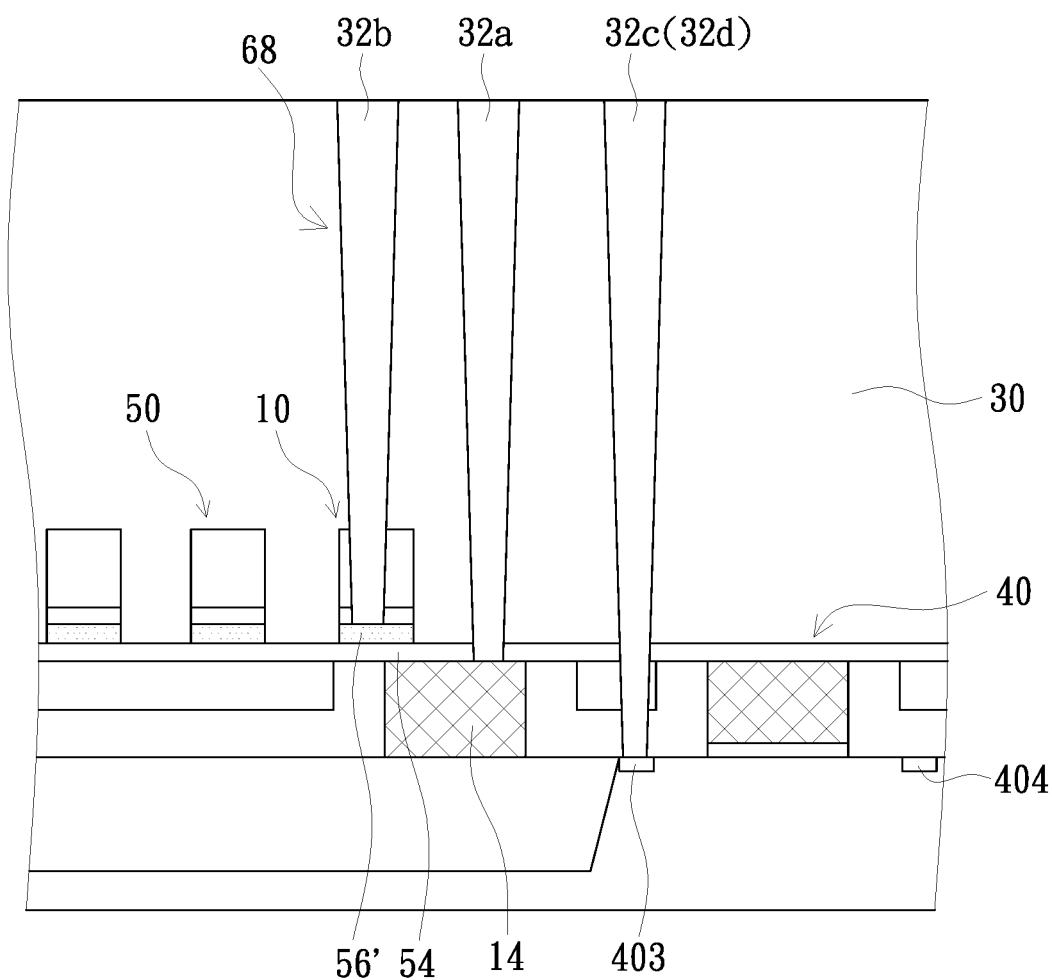

Then, as shown in FIG. 3I, a source electrode 403 and a drain electrode 404 can be respectively formed on the opposite sides of the gate electrode 402 by an ion implantation process first, and then an ILD layer 30 is formed on the semiconductor substrate 12 to cover the capacitor insulating layer 54, the HIR structures 50 and the metal electrode stack structure 18. Then, as shown in FIG. 3J, a plurality of through holes 68 are formed in the ILD layer 30, part of the capacitor insulating layer 54 and the metal electrode stack structure 18, and metal plugs 32a, 32b, 32c (or 32d) are formed in the plurality of through holes 68. FIG. 3J only shows the metal plugs 32a, 32b electrically connected to the OTP memory capacitor structure 10 and the metal plug 32c (or 32d) electrically connected to the source electrode 403 (or the drain electrode 404) of the transistor structure 40. The metal plugs 32a, 32b are respectively electrically connected to the bottom electrode 14 of the OTP memory capacitor structure 10 and the metal layer 56' of the metal electrode stack structure 18, but are not limited thereto. The other HIR structures 50 can optionally be provided with metal plugs (not shown) for electrical connection. In one embodiment, the metal plugs 32a, 32b, 32c (or 32d) can be electrically connected to the back-end metal interconnection layer 34 (shown in FIG. 2) in a subsequent manufacturing process not shown.

In the manufacturing method of the OTP memory capacitor structure of the embodiment of the present invention, by the provision of the first insulating sacrificial layer, the metal layer in the dense distribution area is protected by the first insulating sacrificial layer from being removed by excessive etching when the first etching process is performed. Therefore, in the subsequent process of removing the patterned mask layer, the capacitor insulating layer in the dense distribution area will not be removed because it is not covered by the metal layer. In addition, because the capacitor insulating layer in the dense distribution area remains intact during the process of removing the patterned mask layer, the capacitor insulating layer can be used to protect the bottom electrode from being exposed, so that the integrity of the bottom electrode is not damaged during the second etching process. Therefore, the manufacturing method of the OTP memory capacitor structure of the embodiment of the present invention can effectively avoid the damage of the bottom electrode (e.g., the metal electrode or the polysilicon electrode) by the provision of the (first) insulating sacrificial layer in the metal electrode stack structure, so as to avoid electrical abnormality of OTP memory. Thus, the OTP memory has better electrical characteristics.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A one-time programmable memory (OTP memory) capacitor structure, comprising:
    a semiconductor substrate;
    a bottom electrode, provided on the semiconductor substrate;
    a capacitor insulating layer, provided on the bottom electrode; and
    a metal electrode stack structure, comprising a metal layer, an insulating sacrificial layer and a capping layer stacked in sequence, wherein the metal layer is provided on the capacitor insulating layer and is used as a top electrode, and the insulating sacrificial layer is provided between the metal layer and the capping layer, wherein the side walls of the metal layer, the side walls of the insulating sacrificial layer and the side walls of the capping layer are on the same plane.

2. The one-time programmable memory capacitor structure according to claim 1, wherein the bottom electrode is selected from one of a metal electrode and a polysilicon electrode.

3. The one-time programmable memory capacitor structure according to claim 1, wherein a material of the capacitor insulating layer and the insulating sacrificial layer is oxide.

4. The one-time programmable memory capacitor structure according to claim 1, wherein a material of the metal layer is selected from one of titanium, titanium nitride, tantalum and tantalum nitride.

5. The one-time programmable memory capacitor structure according to claim 1, wherein a material of the capping layer is selected from one of silicon nitride, oxynitride, silicon carbide and silicon oxynitride.

6. The one-time programmable memory capacitor structure according to claim 1, wherein a thickness of the capping layer is greater than a thickness of the insulating sacrificial layer and a thickness of the metal layer.

7. The one-time programmable memory capacitor structure according to claim 1, wherein a thickness of the capping layer is greater than or equal to 250 angstroms, a thickness of the insulating sacrificial layer is between 30 and 50 angstroms, and a thickness of the metal layer is between 30 and 50 angstroms.

8. The one-time programmable memory capacitor structure according to claim 1, further comprising:
   an interlayer dielectric layer, covering the capacitor insulating layer and the metal electrode stack structure;
   at least two contact plugs, respectively electrically connected to the bottom electrode and the metal layer; and
   a back-end metal interconnection layer, provided on the interlayer dielectric layer and electrically connected to the at least two contact plugs.

* * * * *